United States Patent
Drogi et al.

(10) Patent No.: US 9,270,239 B2
(45) Date of Patent: Feb. 23, 2016

(54) ENVELOPE TRACKING SYSTEM WITH INTERNAL POWER AMPLIFIER CHARACTERIZATION

(71) Applicant: Quantance, Inc., Woburn, MA (US)

(72) Inventors: Serge Francois Drogi, Flagstaff, AZ (US); Vikas Vinayak, Menlo Park, CA (US)

(73) Assignee: QUANTANCE, INC., Woburn, MA (US)

( * ) Notice: Subject to any disclaimer, the term of this patent is extended or adjusted under 35 U.S.C. 154(b) by 0 days.

(21) Appl. No.: 14/208,528

(22) Filed: Mar. 13, 2014

(65) Prior Publication Data

US 2014/0266423 A1 Sep. 18, 2014

Related U.S. Application Data

(60) Provisional application No. 61/800,350, filed on Mar. 15, 2013.

(51) Int. Cl.
*H03G 3/20* (2006.01)
*H03F 3/189* (2006.01)
*H03F 1/02* (2006.01)
*H03F 1/32* (2006.01)
*H03F 3/24* (2006.01)

(52) U.S. Cl.
CPC ............. *H03F 3/189* (2013.01); *H03F 1/0227* (2013.01); *H03F 1/32* (2013.01); *H03F 3/24* (2013.01); *H03F 2200/102* (2013.01)

(58) Field of Classification Search
CPC ...................................................... H03G 3/20
USPC .......................... 330/136, 129, 297, 285, 296
See application file for complete search history.

(56) References Cited

U.S. PATENT DOCUMENTS

| 8,018,277 B2* | 9/2011 | Drogi et al. ................... 330/136 |
| 8,050,638 B2* | 11/2011 | Vinayak et al. ................ 455/126 |
| 8,183,917 B2* | 5/2012 | Drogi et al. ................... 330/129 |
| 8,742,844 B2* | 6/2014 | Kousai .......................... 330/136 |
| 2002/0044014 A1 | 4/2002 | Wright et al. |
| 2007/0066224 A1 | 3/2007 | D'Hont et al. |
| 2009/0004981 A1 | 1/2009 | Eliezer et al. |
| 2009/0068966 A1 | 3/2009 | Drogi et al. |
| 2009/0295475 A1 | 12/2009 | Bar-David et al. |
| 2010/0112967 A1 | 5/2010 | Sorensen |
| 2012/0223777 A1 | 9/2012 | Drogi et al. |
| 2012/0252382 A1 | 10/2012 | Bashir et al. |
| 2013/0033314 A1 | 2/2013 | Gudem et al. |

OTHER PUBLICATIONS

PCT International Search Report and Written Opinion, PCT Application No. PCT/US2014/026431, Jul. 25, 2014, 14 pages.

* cited by examiner

*Primary Examiner* — Henry Choe
(74) *Attorney, Agent, or Firm* — Lando & Anastasi, LLP

(57) ABSTRACT

An RF PA system that generates its own local characterization information. The RF PA system includes a PA to generate a RF output signal from a RF input signal, the PA powered by a supply voltage. A characterization block generates characterization information corresponding to a relationship between the supply voltage and performance (e.g., gain, power efficiency, distortion, receive band noise) of the RF PA system for a plurality of levels of one or more operating conditions (e.g., temperature, operating frequency, modulation format, antennae mismatch, etc.) of the RF PA system. An amplitude estimator block estimates an amplitude of the RF input signal. A supply control block generates a supply voltage control signal for controlling the supply voltage based on the characterization information and the amplitude of the RF input signal.

18 Claims, 7 Drawing Sheets

ENVELOPE TRACKING SYSTEM WITH INTERNAL POWER AMPLIFIER CHARACTERIZATION

CROSS REFERENCE TO RELATED APPLICATIONS

This application claims the benefit of U.S. Provisional Patent Application No. 61/800,350, filed on Mar. 15, 2013, which is incorporated by reference herein in its entirety.

BACKGROUND

1. Field of the Disclosure

This disclosure relates generally to envelope tracking power amplifier systems, and more specifically to envelope tracking power amplifier systems with improved characteristics.

2. Description of Related Art

Envelope Tracking (ET) systems may be found in the radio frequency (RF) transmitter section of a radio where power efficiency is important, such as in cellular radios used in mobile phones. A typical ET system includes a variable power supply supplying a power amplifier (PA) with a dynamically changing supply voltage that tracks the amplitude of the modulation. The goal of such an ET system is to improve power efficiency by operating the PA with low headroom.

The supply voltage level can be determined with a look up table that references amplitudes to values for the supply voltage. FIG. 7 illustrates the nature of choices available for a lookup table. As an example, for an amplitude corresponding to PA output power of 22 dBm, the lookup table may contain PA supply voltage values ranging from 1.2V to 5V. The choice of this value may be set to provide a good balance between PA efficiency and linearity. If the PA supply voltage is set too low, the PA operates with lower head room, and thus with higher efficiency, but with higher distortion. Conversely, if the PA supply voltage is set too high, the PA operates with higher head room, and thus with lower efficiency, but the additional headroom allows for lower distortion levels.

The values for the lookup table are typically determined in a factory through characterization on a typical PA on a typical radio device under typical conditions. This initial set of values is then copied into other ET systems. However, during actual operation of the other ET systems, the PA may exhibit different characteristics from those during characterization of the typical PA, depending on factors such as PA process and manufacturing tolerances, power supply circuit variations, environmental factors, temperature, operating frequency modulation formats and antenna mismatch. Thus, the initial set of values may not operate the PA with the right balance of power efficiency and distortion.

SUMMARY

Embodiments of the present disclosure include a RF PA system that generates its own local characterization information. The RF PA system then uses the characterization information to control the supply voltage to the PA. As a result, the RF PA system can control the supply voltage in a manner that more accurately achieves a desired balance between power efficiency and distortion.

In one embodiment, the RF PA system includes a PA to generate a RF output signal from a RF input signal, the PA powered by a supply voltage. A characterization block generates characterization information corresponding to a relationship between the supply voltage and performance (e.g., gain, power efficiency, distortion, receive band noise) of the RF PA system for a plurality of levels of one or more operating conditions (e.g., temperature, operating frequency, modulation format, antennae mismatch, etc.) of the RF PA system. An amplitude estimator block estimates an amplitude of the RF input signal. A supply control block generates a supply voltage control signal for controlling the supply voltage based on the characterization information and the amplitude of the RF input signal.

In one embodiment, a method of operation in the RF PA system comprises generating, in the RF PA system, characterization information corresponding to a relationship between a supply voltage to a PA and performance of the PA for a plurality of levels of an operating condition of the RF PA system, the PA generating an RF output signal based on an RF input signal; estimating, in the RF PA system, an amplitude of the RF input signal; and generating, in the RF PA system, a supply voltage control signal for controlling the supply voltage to the PA based on the characterization information and the amplitude of the RF input signal.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Embodiments of the present disclosure include a RF PA system that generates its own local characterization information using feedback from within the RF PA system itself. The RF PA system then uses the characterization information to control the supply voltage to the PA. As a result, the RF PA system can control the supply voltage in a manner that more accurately achieves a desired balance between power efficiency and distortion. In one embodiment, the RF PA system can perform characterization during normal transmit operation of the RF PA system without interrupting the operation of the RF PA system. In other embodiments, the RF PA system can perform characterization during an offline calibration mode.

Figure 1:
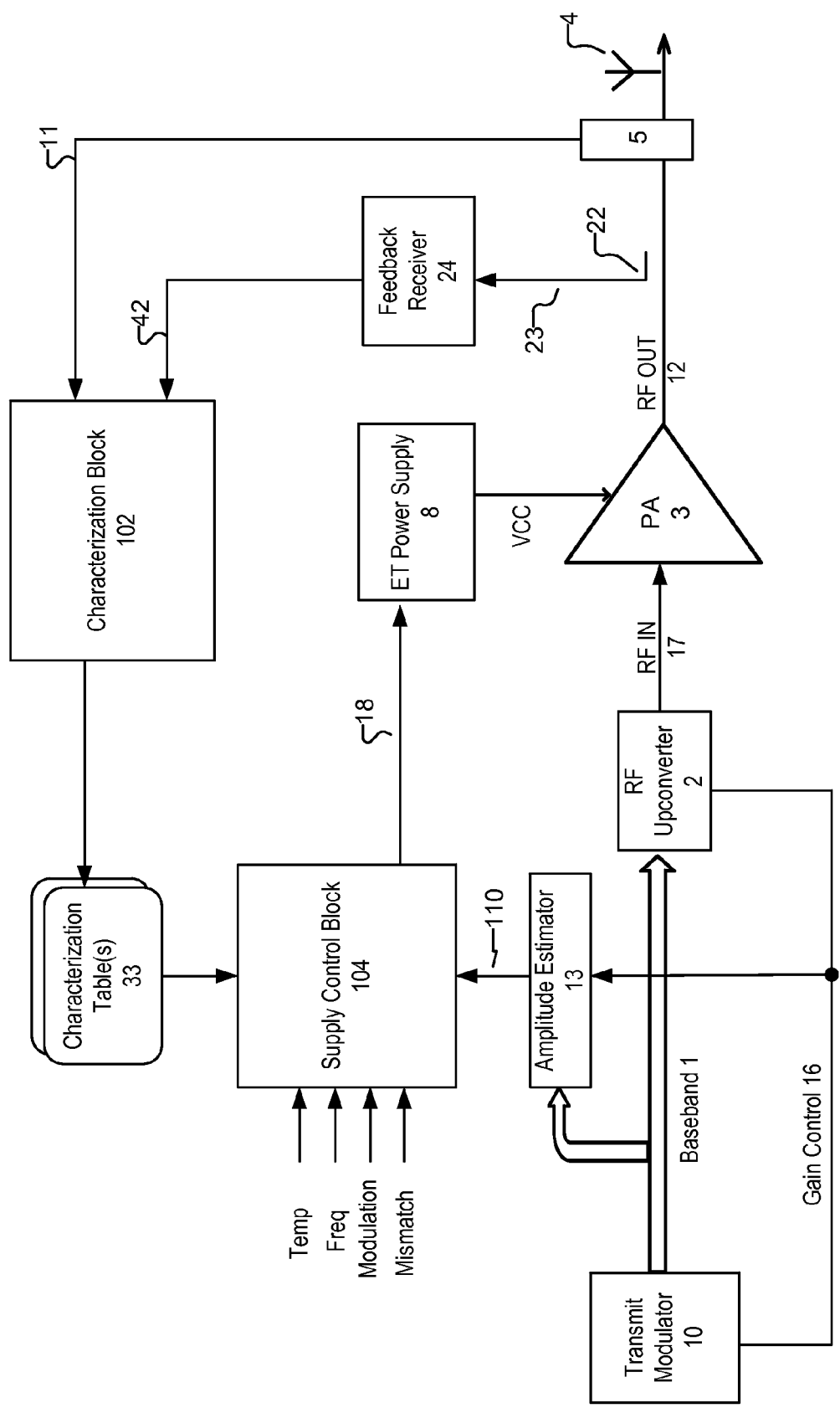
FIG. 1 illustrates a RF PA system, according to an embodiment.

FIG. 1 illustrates a RF PA system, according to an embodiment of the present disclosure. RF PA system includes a transmit modulator 10, an amplitude estimator 13, a RF up converter 2, a power amplifier (PA) 3, an antennae 4, a duplexer 5, a feedback receiver 24, a characterization block 102, characterization information tables 33, a supply control block 104 and an envelope tracking (ET) power supply 8. Each of the blocks shown in the figures can implemented in circuitry or a combination of circuitry and software. RF PA system may be found in a cell phone, mobile hotspot, tablet computer, or any other type of computing device that supports wireless communications. RF PA system can support different wireless transmission standards such as 3G, 4G and Long Term Evolution (LTE) for transmitting wireless signals to a remote device. To simplify the figures, only the transmit path for transmitting outgoing signals is shown in FIG. 1, and the receive path for receiving incoming signals is omitted from FIG. 1.

Transmit modulator 10 generates a digital baseband signal 1 that includes desired information to be transmitted as radio signals to a remote device. Digital baseband signal 1 is up converted by RF up converter 2 to generate a RF input signal 17 that operates at a particular RF carrier frequency. Variable gain RF up converter 2 may be realized by a pair of up converting mixer circuits, followed by a variable gain driver. The gain of the variable gain RF up converter 2 is controlled by the transmit modulator 10 through the gain control signal 16. The gain of the variable gain RF up converter 2 may be adjusted for a variety of reasons, including transmit power control, and noise optimization in the transmit path.

Optional predistortion block (not shown) may also predistort the baseband signal 1 before it reaches the variable gain RF up converter 2. The predistortion block may receive the feedback signal 42 from the feedback receiver 15 and compare this signal 15 to the baseband signal 1 to update its predistortion parameters.

The PA 3 receives and amplifies the RF input signal 17 to generate an RF output signal 12 at the output of the PA 3. RF output signal 12 reaches the antenna 4 after passing through duplexer filter 5 and is transmitted wirelessly by the antenna 4 to a remote device. Duplexer filter 5 provides isolation between the RF output signal 12 and receive (RX) signal 11 from the antenna 4, while passing the RF output signal 12 to the antenna 4. The PA 3 is powered by an envelope tracking supply voltage VCC that tracks the envelope amplitude of the RF input signal 17. The level of the supply voltage VCC is important because it strikes a balance between PA 3 power efficiency and linearity. In general, if the supply voltage is low, the PA 3 operates with lower headroom, and thus with higher efficiency, but higher distortion. Conversely, if the supply voltage values are set higher, the PA 3 operates with higher headroom, and thus with lower efficiency, but the additional headroom allows for lower distortion levels.

Digital baseband transmit signal 1 is also fed to the amplitude estimator 13. The amplitude estimator 13 determines the envelope amplitude of the RF input signal 17 and generates an input amplitude signal 110 that is indicative of the amplitude of the RF input signal 17. Amplitude estimator 13 first estimates the amplitude of digital transmit signal 1 utilizing the formula amplitude=sqrt($I^2+Q^2$), where I and Q are the in phase and quadrature components of the digital baseband transmit signal 1, respectively. Amplitude estimator 13 then adds the gain of variable gain RF up converter 2 indicated by gain control signal 16 to this result. Since the gain of variable gain RF up converter 2 is controlled by transmit modulator 10, gain control signal 16 is also fed into amplitude estimator 13 so that amplitude estimator 13 knows the gain of the variable gain RF up converter 2.

Supply control block 104 receives the input amplitude signal 110 and generates a supply control signal 18 that varies as the RF input amplitude indicated by the input amplitude signal 110 changes. The supply control block 104 takes into account different operating conditions of the RF PA system when generating the supply control signal 18. Examples of operating conditions include the ambient temperature of the RF PA system, the operating frequency of the RF PA system (e.g., RF carrier frequency), the modulation format of the baseband signal 1 (e.g., orthogonal frequency divisional multiplexing, phase-shift keying), the amount of antennae mismatch at the output of the PA 3 (e.g. output impedance mismatch) and various environmental factors. The supply control block 62 may generate the supply control signal 18 using a look up table that references amplitude values of the input amplitude signal 110 to supply voltage values for the supply control signal 18. Alternatively, supply control block 104 may use an equation that calculates a value for the supply control signal 18 from the input amplitude signal 110.

Figure 2:
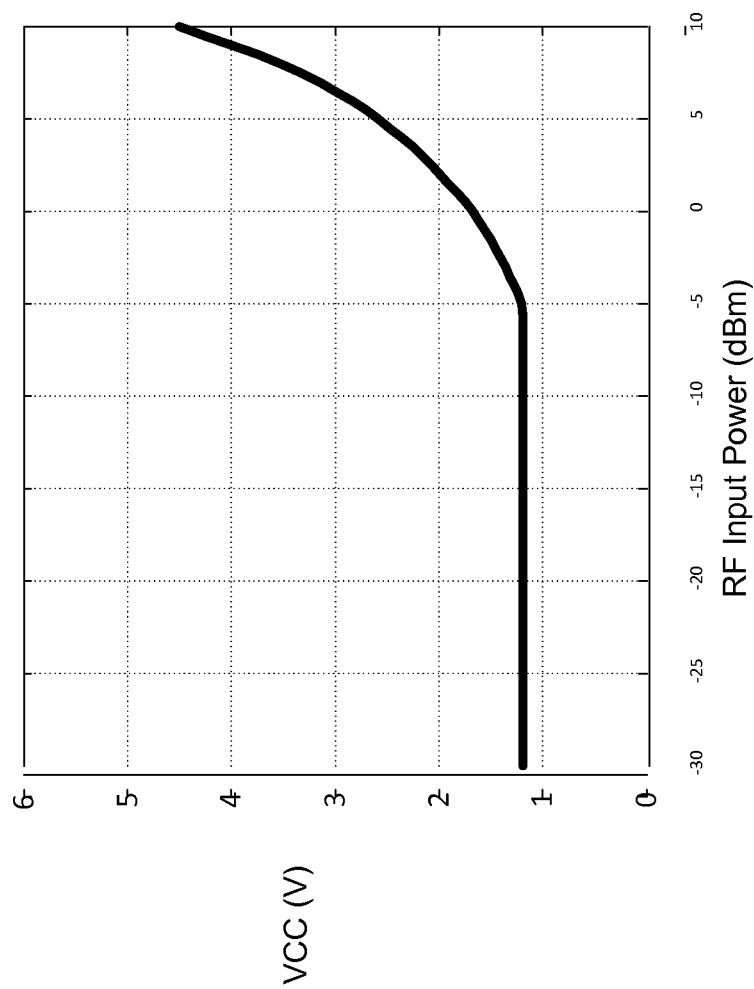
FIG. 2 illustrates a graph of a relationship between RF input power to the PA and the supply voltage VCC, according to an embodiment.

The ET power supply 8 controls the level of the supply voltage VCC in accordance with the supply control signal 18. Examples of ET power supply 8 include linear regulators, switching power supplies, and hybrid power supplies that utilize both a linear regulator and a switching power supply. Referring briefly to FIG. 2, illustrated is a graph of relationship between RF input power to the PA 3 and the supply voltage VCC (which corresponds to supply control signal 118), according to an embodiment. The horizontal axis represents the RF input power to the PA, which corresponds to the amplitude of the RF input signal 17. The vertical axis represents the supply voltage VCC to the PA 3. The supply voltage VCC is controlled in an envelope tracking manner such that the supply voltage VCC substantially tracks the RF input power when the RF input power is greater than −5 dBm. Note that the supply voltage VCC is held substantially constant at a minimum level of 1.2 V when the RF input power is less than −5 dBm so that the PA 3 may remain biased properly.

Referring back to FIG. 1, decoupler 22 and characterization block 102 form a feedback path for characterizing the RF PA system and generating the characterization tables 33. Decoupler 22 provides a coupled version 23 of the RF output signal 12 to the feedback receiver 24. Feedback receiver 24 estimates an amplitude of the RF output signal 12 by down-converting coupled output signal 23, demodulating the down-converted signal, and estimating its amplitude by utilizing the formula Amplitude=sqrt($I^2+Q^2$). The feedback receiver 24 then generates an output amplitude signal 42 indicative of the amplitude of the RF output signal 12.

Characterization block 102 receives the output amplitude signal 42, the RX signal 11 and other information and uses these inputs to measure performance characteristics (e.g. gain, power efficiency, distortion, receive band noise) of the RF PA system. Examples of performance characteristics include gain, power efficiency, distortion, and receive band noise, among others.

The performance characteristics are measured across many different RF input levels and supply voltage values for different levels (e.g., different dimensions or states) of operating conditions of the RF PA system. The characterization block 102 then generates one or more characterization tables 33 that include characterization information describing relationships between different RF input levels, supply voltage values, operating condition levels, RF output levels and the measured performance levels of the RF PA system. The characterization tables 33 can be stored in a memory, such as a non-volatile memory.

The table below is an example of entries that may be found in a characterization table.

TABLE 1

| RF Input | VCC value | Temp | Frequency | RF Output | Gain | Efficiency |
|---|---|---|---|---|---|---|
| 5 dBm | 2.4 | 20 C. | 1700 MHz | 25 dBm | 20 dBm | 50% |
| 5 dBm | 2.5 | 20 C. | 1700 MHz | 25.1 dBm | 20.1 dBm | 51% |
| 5 dBm | 2.4 | 20 C. | 1720 MHz | 25 dBm | 20 dBm | 53% |
| 5 dBm | 2.5 | 20 C. | 1720 MHz | 25.1 dBm | 20.1 dBm | 51% |
| 0 dBm | 2.4 | 20 C. | 1700 MHz | 20 dBm | 20 dBm | 49% |
| 0 dBm | 2.5 | 20 C. | 1700 MHz | 20 dBm | 20 dBm | 48% |

The operating conditions in Table 1 include temperature and frequency. The performance characteristics in Table 1 include gain and power efficiency. Table 1 illustrates just a small portion of a characterization table 33. In practice, the characterization tables 33 may have hundreds or more of different entries spread across one or more tables that capture different combinations of RF input amplitude, supply voltage values, operating condition levels, performance characteristics, and RF output amplitude. In one embodiment, characterization tables 33 may include equations which relate RF input amplitude, supply voltage values to RF output amplitude and performance characteristics under given operating conditions. The equations may compute a performance characteristic of the RF PA system from variables for different operating conditions, RF input amplitude, and supply voltage.

The supply control block 104 uses the characterization information in the characterization tables 33 to determine values for the supply control signal 18 that balance power efficiency and distortion for current levels of one or more operating conditions (e.g. temperature, frequency, modulation, impedance mismatch) of the RF PA system. Because the characterization tables 33 are generated locally at the RF PA system during normal operation of the RF PA system, it allows the supply control block 104 to control the supply voltage VCC in a manner that more accurately balances power efficiency and distortion to adapt to actual operating conditions than would otherwise be possible.

In one embodiment, a delay alignment block (not shown) may also insert a time delay at ET power supply 8 or within variable gain RF up converter 2 to ensure proper time synchronization between the supply voltage VCC and the amplitude of the RF output signal 12.

Figure 3:
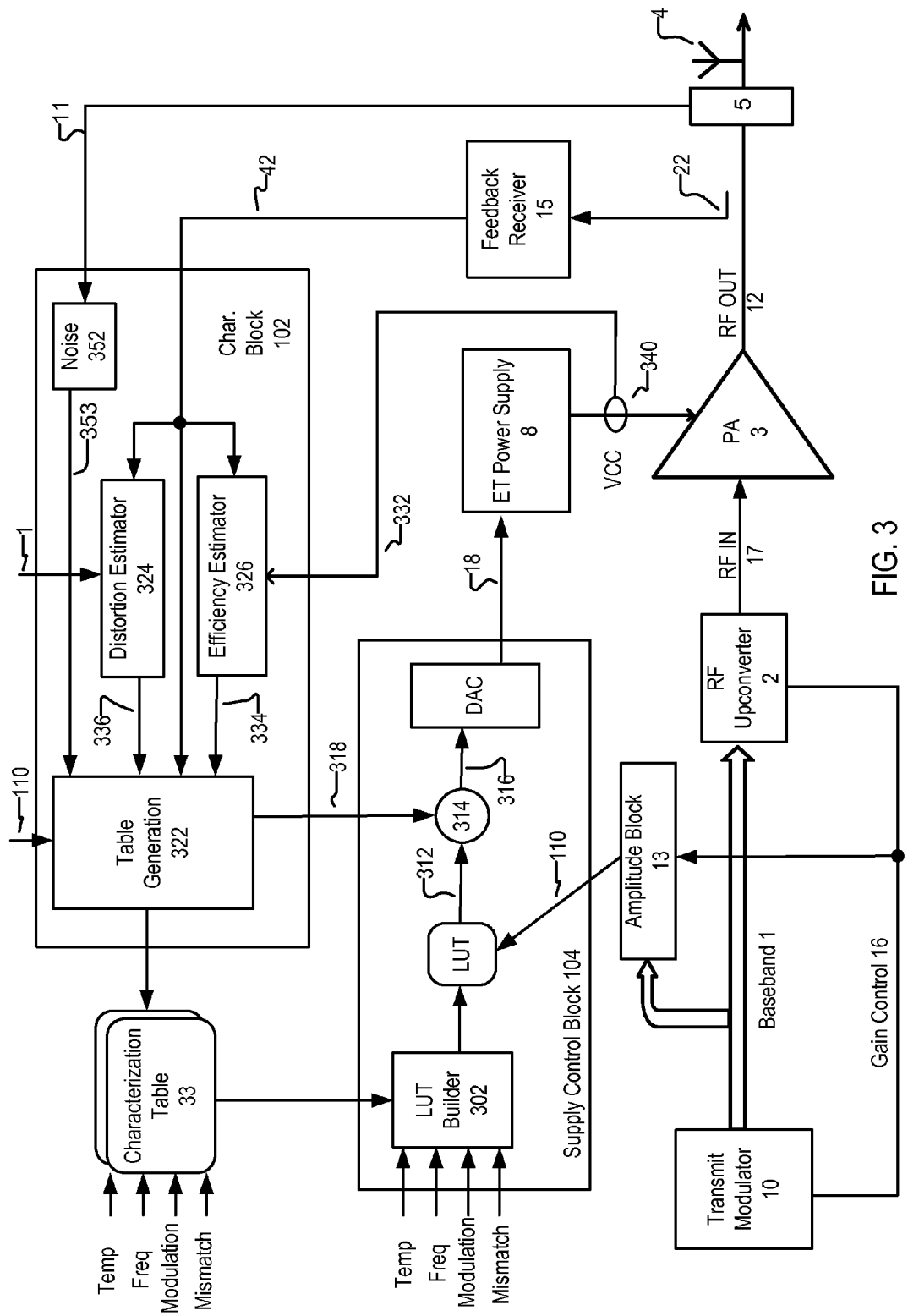
FIG. 3 illustrates a more detailed view of the RF PA system from FIG. 1, according to an embodiment.

FIG. 3 illustrates a more detailed view of the RF PA system from FIG. 1, according to an embodiment. Supply control block 104 includes a look up table (LUT) builder block 302, a LUT, a supply voltage adjustment block 314 and a digital to analog converter (DAC). The LUT references amplitude levels of the amplitude signal 110 to digital supply voltage values. For example, the LUT may have 32 entries for supply voltage values, corresponding to RF input power levels of −21 dB to +10 dBm spaced 1 dB apart.

The initial supply voltage values in the LUT are typically determined in a factory through characterization of a typical PA on a typical radio device under typical conditions. The LUT may be populated with this set of nominal supply voltage values which are appropriate for various values of expected RF output 12 signal amplitudes, based on the expected gain of the PA, under nominal conditions.

The LUT outputs supply voltage values 312, which are adjusted by the supply voltage adjustment circuit 314 into adjusted supply voltage values 316. The operation of the voltage adjustment circuit 114 will be explained by greater detail below in reference to the characterization block 102. The adjusted supply voltage values 316 are converted into an analog supply control signal 18 with a digital to analog converter DAC. The supply control signal 18 controls ET power supply 8 to output specific supply voltage VCC levels for supplying PA 3 with power.

During actual operation in the radio, the PA 3 may exhibit different characteristics from those during operation of the typical PA 3 in the factory, depending on factors such as PA process and manufacturing tolerances, power supply circuit variations, environmental factors, temperature, operating frequency, modulation formats, antenna mismatch to name a few. Due to these unpredictable variations in characteristics, the default LUT entries may not be well suited for operating the RF PA system at target power efficiency and distortion levels. To account for these variations, the characterization block 102 characterizes the RF PA system by perturbing the system with small changes to the supply voltage VCC, so as not to cause excessive distortion in the RF PA system, while also measuring performance characteristics of the RF PA system. This process is repeated for different operating condition levels and amplitudes of the RF input signal 17 to generate the characterization tables 33. The LUT builder 302 then uses the characterization tables 33 to change and refine the values in the LUT.

Alternatively, instead of perturbing the supply voltage VCC, other embodiments may introduce perturbations to the RF input signal 17 and measure the performance characteristics while perturbing the RF input signal 17.

The characterization block 102 includes a table generation block 322, a distortion estimator 324, an efficiency estimator 326 and a noise estimator 352. Characterization typically occurs while the RF PA system is operating in normal transmit operation without an offline calibration mode. In other words, characterization occurs while the transmit modulator 10 is generating a baseband signal 1 that includes information to be transmitted to a remote device. The baseband signal 1 is converted to an RF input signal 17 and amplified into a RF output signal 12. The RF input amplitude is provided to the LUT that outputs a supply voltage value 312 using the initial LUT values. At the same time, the table generation block 322 also generates a voltage adjustment signal 318 specifying a target level of adjustment (e.g., a multiplication factor) for the supply voltage VCC. The supply voltage adjustment circuit 314 then adjusts the supply voltage value 312 into an adjusted supply voltage value 316 that is converted into a supply control signal 18.

Figure 4:
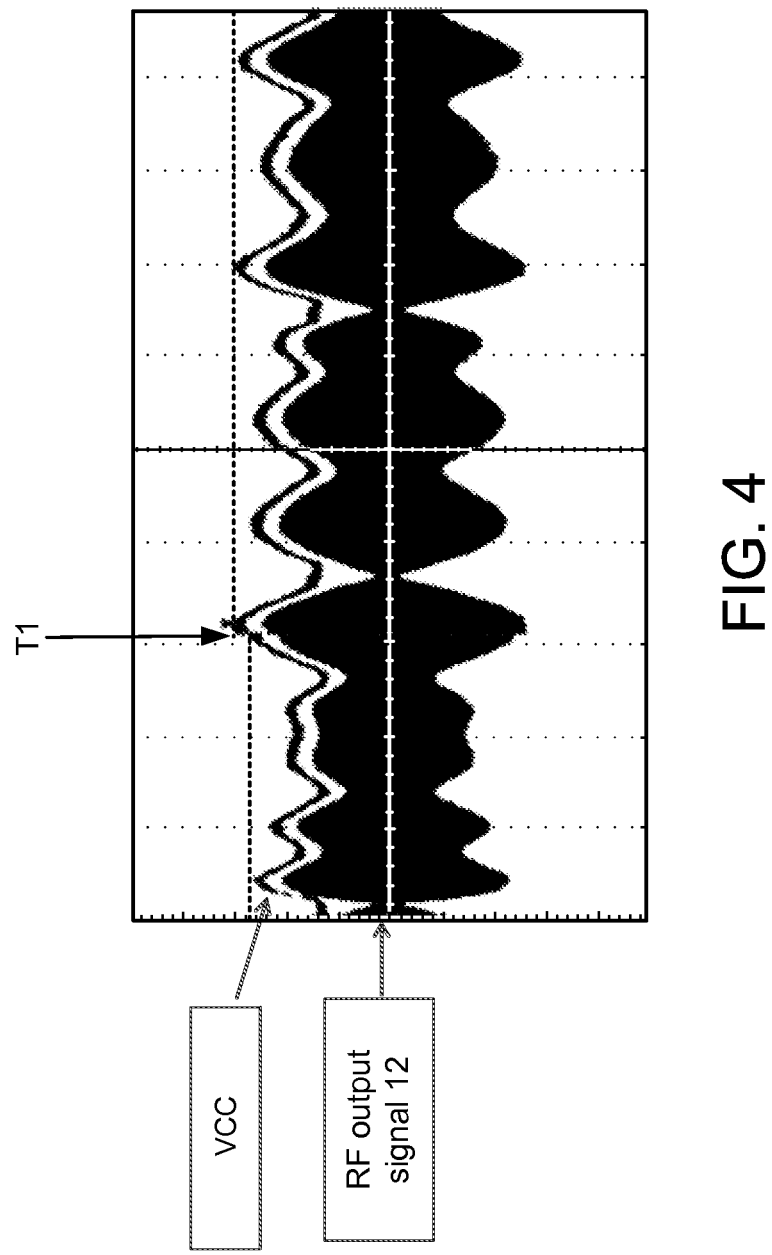
FIG. 4 illustrates waveforms for an adjustment to the supply voltage VCC during characterization, according to an embodiment.

Referring briefly to FIG. 4, illustrated are waveforms illustrating an adjustment to the supply voltage VCC during characterization, according to an embodiment. FIG. 4 includes a waveform for the RF output signal 12 and a waveform for the supply voltage VCC that tracks the amplitude of the RF output signal 12. Prior to time T1, the supply voltage VCC is generated using the default supply voltage values 312 without any adjustment. At time T1, the default supply voltage values 312 are adjusted by the voltage adjustment signal 318, which causes a discontinuity in the supply voltage VCC. The discontinuity is small enough so that any distortion in the RF output signal 12 still falls below the threshold of regulatory amplitude or phase error requirements. After time T1, the supply voltage VCC continues to be generated by adjusting the default LUT values. The adjustment causes a slight increase in the supply voltage VCC after time T1. In other embodiments the adjustment can cause a decrease in the supply voltage VCC instead of an increase in the supply voltage VCC.

Referring back to FIG. 3, efficiency estimator block 326 estimates the power efficiency of the PA 3 associated with the adjusted supply voltage VCC and generates a power efficiency signal 334 indicative of the estimated power efficiency. In one embodiment, efficiency estimator 40 estimates the power efficiency with the following equation:

$$Pefficiency = \frac{Pout \times \text{Mismatch}}{Pconsumed} \quad \text{(equation 1)}$$

Pout is the power at the output of the PA. Pout is determined by squaring the RF output amplitude (indicated by the output amplitude signal 42). Mismatch is a factor representing an impedance mismatch at the output of the PA. Mismatch may be a fixed value or a variable value empirically determined based on impedance mismatch calculated from the power ratio and phase difference between forward and reverse power detected with forward and reverse connected directional couplers (not shown) coupled to the output of PA 3. Pconsumed is the power consumed by the PA 3. Pconsumed is determined by sampling, through sampling signals 332 obtained from sampling circuit 340, the current and the voltage supplied to PA 3 and then multiplying the sampled current and the sampled voltage. In another embodiment, since the level of the supply voltage VCC is known at any given time, the sampling circuit 340 only samples the supply current instead of the supply voltage VCC.

Distortion estimator block 324 estimates distortion of the PA 3 associated with the adjusted supply voltage VCC and generates one or more distortion signals 336 indicative of the estimated distortion levels. In one embodiment, the distortion estimator block 324 receives the baseband signal 1 that includes the desired transmit information. The distortion estimator block 324 compares the amplitude of the baseband signal 1 to the RF output amplitude (indicated by the output amplitude signal 42) to estimate the distortion of the PA 3. Greater differences between the desired transmit signal and the RF output amplitude indicate a higher amount of distortion.

In another embodiment, the distortion estimator block 324 stores samples of the RF output amplitude over time and determines AM-AM distortion (i.e. amplitude distortion) or AM-PM distortion (i.e. phase distortion) of the PA from the samples. AM-AM distortion is calculated as a ratio of the change in the RF output amplitude to the change in the supply voltage VCC. AM-PM distortion is calculated as a ratio of measured change in the RF output phase to the change in the supply voltage VCC. Ideally, the AM-PM distortion and the AM-PM distortion should be flat. In a further embodiment, the distortion estimator block 324 can measure distortion in the form of adjacent-channel leakage power (ACP).

In some embodiments, distortion can be represented with a polynomial that accounts for memory effects of the RF PA system. Memory effects refer to the fact that past conditions in the RF PA system that can affect current levels of distortion in the RF PA system.

Noise estimator block 352 receives the RX signal 11 and estimates a receive band noise 352 in the RX signal 11. Changing the supply voltage VCC 340 to the PA 3 can sometimes introduce noise into the RX signal 11. The noise estimator block estimates this noise and then generates a noise estimation signal indicative of the level of receive band noise 352.

The table generation block 322 receives the input amplitude signal 110, output amplitude signal 42, distortion signals 336, power efficiency signal 326 and noise estimation signal 353. Table generation block 322 generates an entry in the characterization table 33 that relates the RF input amplitude, the supply voltage values for the adjusted supply voltage VCC, the RF output amplitude, the levels of the operating conditions, and the level of the performance characteristics (e.g. gain, power efficiency, distortion, noise). This process may be repeated many times for different RF input amplitudes, different supply voltage values, and different levels of operating conditions to generate many different table entries. The result is a collection of characterization information describing the relationship between RF input amplitudes, supply voltage values, RF output amplitudes, operating conditions, and performance characteristics, for example, as shown in Table 1.

In one embodiment, the table generation block 322 estimates the gain of the PA 3 from the input amplitude signal 110 and the output amplitude signal 42. In other embodiments the table generation block 322 may obtain amplitude information for the RF input signal directly from the LUT and use this amplitude information to estimate the gain.

Once the characterization tables 33 are created, the LUT builder 302 then utilizes the characterization tables 33 to generate a new set of supply voltage values 312 for the LUT according to the current operating conditions (e.g., temperature, frequency, modulation, mismatch) currently present in the system. For example, the LUT builder 302 may receive signals indicating that current operating conditions are a temperature of 25 degrees C., a carrier frequency of 1700 MHz, a modulation type of PSK and zero impedance mismatch. The LUT builder 302 then generates supply voltage values 312 for this set of current operating conditions. In some embodiments the LUT builder block 302 may generate a more complex LUT that uses one or more operating conditions as an input to the LUT.

The supply voltage values 312 may be interpolated or extrapolated from information in the characterization tables 33. Alternatively, the equations in characterization tables 33 may be utilized to generate the new supply voltage values 312 for the LUT.

In one embodiment, the LUT builder 302 generates a LUT keeps the RF PA system operating a range of target performance levels under the current operating conditions. For example, the LUT can be generated such that the PA 3 produces distortion within an acceptable target range and also has power efficiency within an acceptable target range. The LUT builder 302 may also generate the LUT that keeps the RF PA system operating at a specific target performance level. For example, the LUT can be generated such that the PA 3 has constant gain. As another example, the LUT can be generated such that the PA 3 has constant AM-AM distortion.

Figure 5:
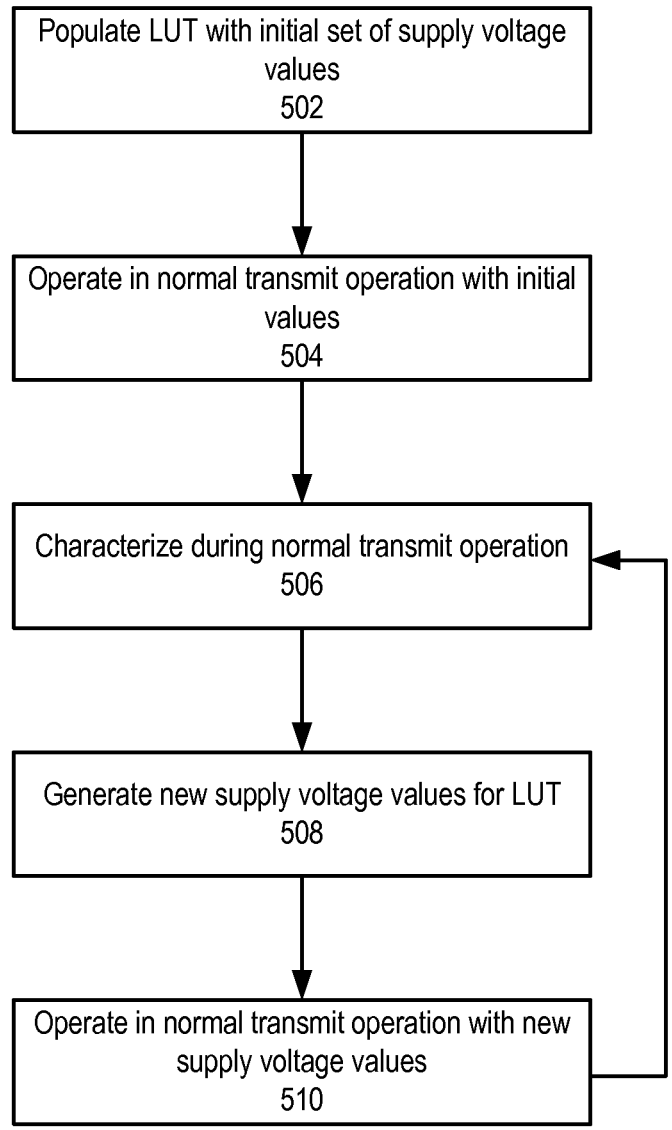
FIG. 5 illustrates a method of operation in a RF PA system, according to an embodiment.

FIG. 5 illustrates a method of operation in a RF PA system, according to an embodiment. In step 502, the LUT is populated with an initial set of supply voltage values 312. The initial values are typically generic values that are appropriate for a typical radio device under typical operating conditions. In step 504, the RF PA system operates in normal transmit operation by generating a baseband signal 1 with desired transmit information that is transmitted to a remote device through the antennae 4. The RF PA system also uses the initial set of supply voltage values 312 in controlling the supply voltage VCC.

In step 506, during an initial period of time while the RF PA system is operating in normal transmit operation, the characterization block 102 characterizes the RF PA system without interrupting the operation of the RF PA system. The characterization block 102 adjusts the supply voltage value 312 in order to adjust the supply voltage VCC. The characterization block 102 assesses the resulting performance (e.g. power efficiency, distortion and receive band noise) associated with the adjusted supply voltage VCC. The characterization block 102 then generates new entries for the characterization table 33.

In step 508, once characterization is completed, the supply control block 104 uses the characterization table 33 to generate new supply voltage values 312 for the LUT. In step 510, during a later period in time, the new supply voltage values 312 for the LUT are then used to control the supply voltage control signal 18 and therefore also the supply voltage VCC. Steps 506, 508 and 510 may also be repeated at periodic intervals to capture any changes in the characteristics of the RF PA system that may occur over time and to further refine the LUT.

Figure 6:
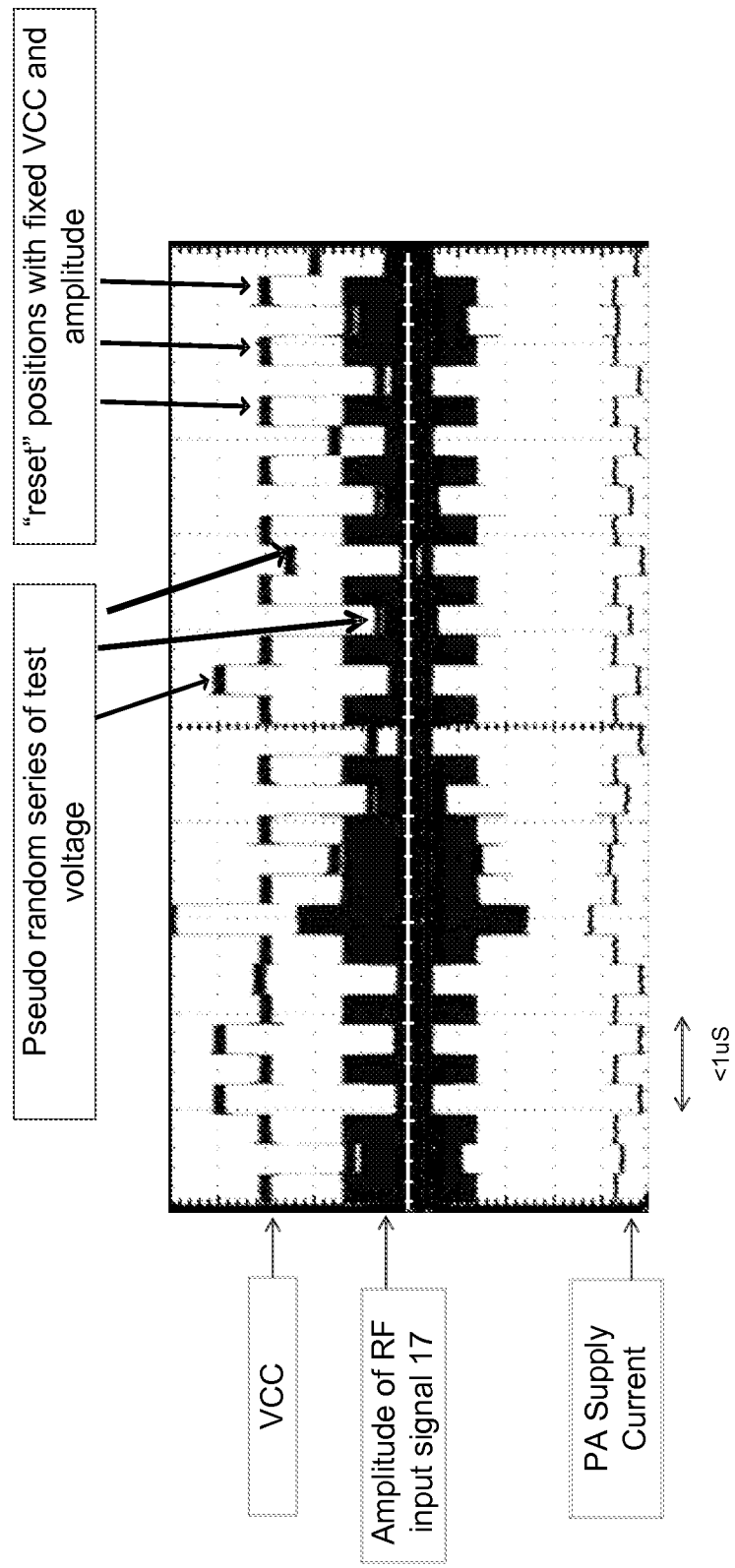
FIG. 6 illustrates adjustments to the supply voltage VCC during characterization, according to another embodiment.
Figure 7:
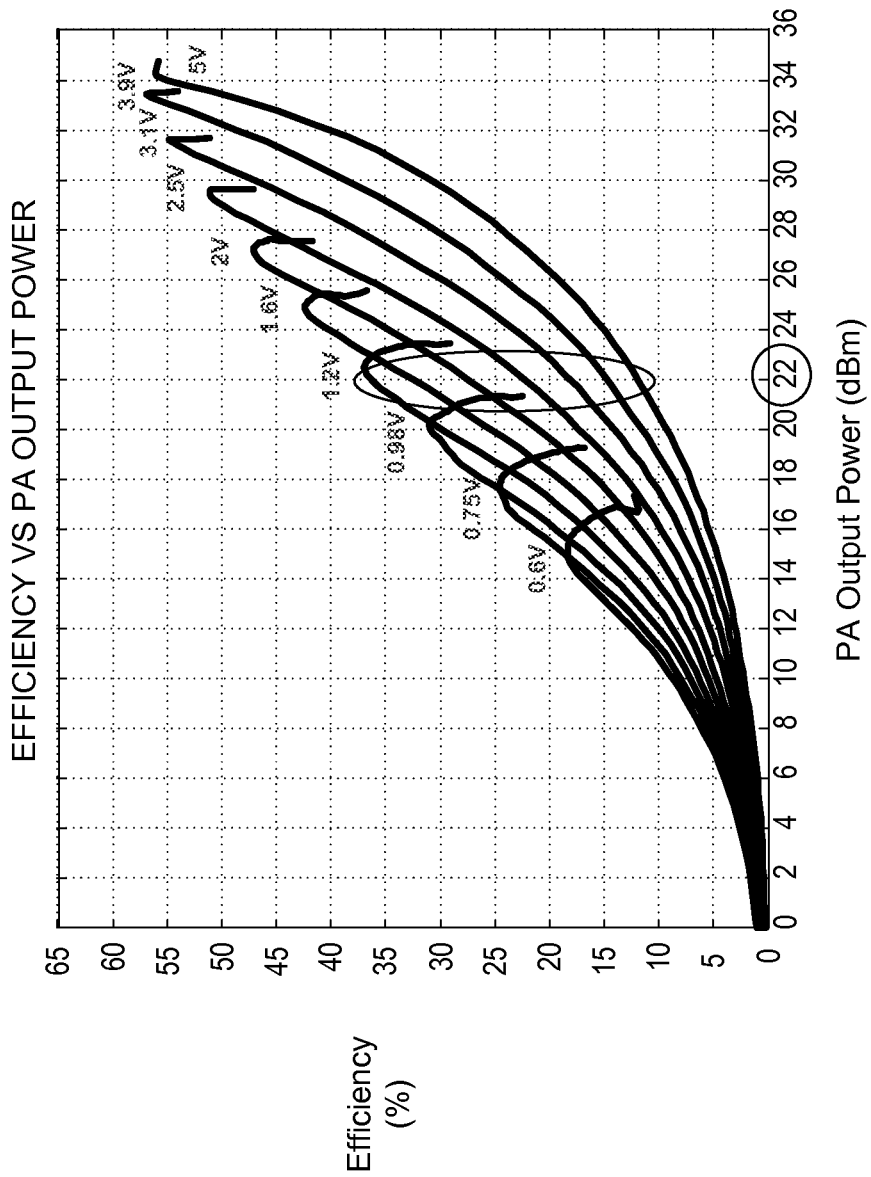
FIG. 7 illustrates the nature of choices available for a lookup table.

FIG. 6 illustrates adjustments to the supply voltage VCC during characterization, according to another embodiment. FIG. 6 includes waveforms for the supply voltage VCC, the amplitude of the RF input signal 17, and the supply current to the PA 3. The baseband signal 1 is generated with a randomized (i.e. random or pseudorandom) pattern, which causes the amplitude of the RF input signal 17 to also have the same randomized pattern. The randomized pattern of the baseband signal 1 causes the amplitude of the RF input signal 17 to alternate between reset positions having fixed amplitude and randomized positions having random amplitude. The supply voltage VCC has a different randomized pattern. The randomized pattern of the supply voltage VCC also alternates between reset positions having fixed voltage levels and randomized positions having random voltage levels. Each new amplitude of the RF input signal 17 corresponds to a different level of the supply voltage VCC. The randomized patterns speed up the building of the characterization tables 33 and may be generated in a dedicated offline characterization mode. As before, characterization block 102 estimates power efficiency and distortion levels for different RF input amplitudes and supply voltage VCC levels to generate new entries for the characterization table 33.

Upon reading this disclosure, those of skill in the art will appreciate still additional alternative structural and functional designs for a RF PA system according to the present disclosure. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure without departing from the spirit and scope of the disclosure.

What is claimed is:

1. A radio frequency (RF) power amplifier system, comprising:
a power amplifier to generate a RF output signal from a RF input signal, the power amplifier powered by a supply voltage;
a characterization block to generate an adjustment signal for adjusting the supply voltage in a first time period and generate characterization information as the supply voltage is adjusted during the first time period, the characterization information corresponding to a relationship between the supply voltage and performance of the RF power amplifier system for a plurality of levels of one or more operating conditions of the RF power amplifier system;
an amplitude estimator block to estimate an amplitude of the RF input signal; and
a supply control block to generate a supply voltage control signal for controlling the supply voltage to the power amplifier based on initial supply voltage values in a look up table and the amplitude of the RF input signal during the first time period, and to generate the supply voltage control signal based on the characterization information and the amplitude of the RF input signal in a second time period.

2. The RF power amplifier system of claim 1 further comprising a feedback block to estimate an amplitude of the RF output signal, the characterization block configured to generate the characterization information based on the amplitude of the RF output signal.

3. The RF power amplifier system of claim 1 wherein the characterization block estimates the performance of the RF power amplifier system across a plurality of levels of the supply voltage and generates the characterization information based on the estimated performance of the RF power amplifier system.

4. The RF power amplifier system of claim 1 wherein the characterization block generates the characterization information during normal transmit operation of the RF power amplifier system.

5. The RF power amplifier system of claim 1 wherein the characterization block generates the characterization information while the supply voltage and RF input signal are provided with randomized patterns.

6. The RF power amplifier system of claim 1 wherein the supply control block generates the look up table based on the characterization information and generates the supply voltage control signal based on values in the look up table corresponding to the amplitude of the RF input signal.

7. The RF power amplifier system of claim 1 wherein the supply control block generates the supply voltage control signal based on a current level of the operating condition of the RF power amplifier system.

8. The RF power amplifier system of claim 1 wherein the characterization information corresponds to a relationship between the supply voltage and a gain of the power amplifier for a plurality of levels of one or more operating conditions of the RF power amplifier system.

9. The RF power amplifier system of claim 1 wherein the characterization information corresponds to a relationship between the supply voltage and power efficiency of the RF power amplifier system for a plurality of levels of one or more operating conditions of the RF power amplifier system.

10. The RF power amplifier system of claim 1 wherein the characterization information corresponds to a relationship between the supply voltage and distortion of the RF power amplifier system for a plurality of levels of one or more operating conditions of the RF power amplifier system.

11. The RF power amplifier system of claim 1 wherein the characterization information corresponds to a relationship between the supply voltage and receive band noise in the RF power amplifier system for a plurality of levels of one or more operating conditions of the RF power amplifier system.

12. The RF power amplifier system of claim 1 wherein the operating condition of the RF power amplifier system is at least one of temperature, operating frequency, modulation format, and antennae mismatch.

13. A method of operation in a radio frequency (RF) power amplifier system, the method comprising:
  generating, by a power amplifier, an RF output signal based on an RF input signal;
  generating an adjustment signal for adjusting a supply voltage to the power amplifier in a first time period;
  generating characterization information as the supply voltage is adjusted in the first time period, the characterization information corresponding to a relationship between the supply voltage to the power amplifier and performance of the power amplifier for a plurality of levels of an operating condition of the RF power amplifier system;
  estimating an amplitude of the RF input signal;
  generating a supply voltage control signal for controlling the supply voltage to the power amplifier based on initial supply voltage values in a look up table and the amplitude of the RF input signal in the first time period; and
  generating the supply voltage control signal for controlling the supply voltage to the power amplifier based on the characterization information and the amplitude of the RF input signal in a second time period.

14. The method of claim 13 further comprising estimating an amplitude of the RF output signal, the characterization information being generated based on the amplitude of the RF output signal.

15. The method of claim 13 further comprising estimating the performance of the RF power amplifier system across a plurality of levels of the supply voltage, the characterization information being generated based on the estimated performance of the RF power amplifier system.

16. The method of claim 13 wherein the characterization information is generated during normal transmit operation of the RF power amplifier system.

17. The method of claim 13 wherein the characterization information is generated while the supply voltage and RF input signal are provided with randomized patterns.

18. The method of claim 13 wherein generating the supply control signal includes generating the look up table based on the characterization information and generating the supply voltage control signal based on values in the look up table corresponding to the amplitude of the RF input signal.

\* \* \* \* \*